(12) United States Patent
Oraw et al.

(10) Patent No.: US 9,324,693 B2
(45) Date of Patent: Apr. 26, 2016

(54) FOLDED 3-D LIGHT SHEETS CONTAINING PRINTED LEDS

(71) Applicant: Nthdegree Technologies Worldwide Inc., Tempe, AZ (US)

(72) Inventors: Bradley Steven Oraw, Chandler, AZ (US); Travis Thompson, Chandler, AZ (US); Alexander Ray, Tempe, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 0 days.

(21) Appl. No.: 14/481,393

(22) Filed: Sep. 9, 2014

(65) Prior Publication Data

US 2015/0069431 A1 Mar. 12, 2015

Related U.S. Application Data

(60) Provisional application No. 61/875,303, filed on Sep. 9, 2013.

(51) Int. Cl.
*H01L 29/20* (2006.01)
*H01L 25/075* (2006.01)
*H01L 33/62* (2010.01)

(52) U.S. Cl.
CPC ............. *H01L 25/0753* (2013.01); *H01L 33/62* (2013.01); *H01L 2924/0002* (2013.01)

(58) Field of Classification Search
CPC .. G02B 21/06; G02B 21/367; G02B 51/5234; G02B 25/0753
USPC ...................................................... 257/88–99
See application file for complete search history.

(56) References Cited

U.S. PATENT DOCUMENTS

| | | | |
|---|---|---|---|
| 2005/0214963 A1 | 9/2005 | Daniels et al. | |
| 2009/0114928 A1* | 5/2009 | Messere | B32B 17/10 257/88 |
| 2011/0063838 A1* | 3/2011 | Dau | F21S 8/04 362/235 |
| 2011/0163683 A1* | 7/2011 | Steele | F21K 9/135 315/192 |
| 2011/0193105 A1* | 8/2011 | Lerman | H01L 25/0753 257/88 |

FOREIGN PATENT DOCUMENTS

| | | |
|---|---|---|
| EP | 2639495 A2 | 9/2013 |
| WO | 2012148384 A1 | 11/2012 |

OTHER PUBLICATIONS

EPO as ISA, PCT/US15/44457, filed Aug. 10, 2015, "International Search Report and Written Opinion", dated Nov. 17, 2015, 14 pages.

* cited by examiner

*Primary Examiner* — Cuong Q Nguyen
*Assistant Examiner* — Nishath Yasmeen
(74) *Attorney, Agent, or Firm* — Patent Law Group LLP; Brian D. Ogonowsky (57) ABSTRACT

A method of forming a light sheet includes printing a layer of inorganic LEDs on a first conductive surface of a substrate, depositing a first dielectric layer, and depositing a second conductor layer over the LEDs so that the LEDs are connected in parallel. At least one of the first conductive surface or the second conductor layer is transparent to allow light to escape. A phosphor layer may be formed over the light sheet so that the LED light mixed with the phosphor light creates white light. The flat light sheet is then folded, such as by molding, to form a three-dimensional structure with angled light emitting walls and reflective surfaces to control a directionality of the emitted light and improve the mixing of light. The folds may form rows of angled walls or polygons.

21 Claims, 9 Drawing Sheets

FOLDED 3-D LIGHT SHEETS CONTAINING PRINTED LEDS

CROSS-REFERENCE TO RELATED APPLICATIONS

This application is based on U.S. provisional application Ser. No. 61/875,303, filed Sep. 9, 2013, by Bradley S. Oraw et al., assigned to the present assignee and incorporated herein by reference.

FIELD OF THE INVENTION

This invention relates to a light sheet having an array of printed light emitting diodes (LEDs) and, in particular, to forming a 3-dimensional folded light sheet to achieve various light emission characteristics.

BACKGROUND

The present assignee has previously invented a flat light sheet formed by printing microscopic inorganic (GaN) vertical LED dice over a conductor layer on a flexible substrate film to electrically contact the LED's bottom electrodes, then printing a thin dielectric layer over the conductor layer which exposes the LED's top electrodes, then printing another conductor layer to contact the LED's top electrodes to connect them in parallel. Either or both conductor layers may be transparent to allow the LED light to pass through. The LEDs may be printed to have a large percentage of the LEDs with the same orientation so the light sheet may be driven with a DC voltage. The light sheet may have a thickness between 5-13 mils, which is on the order of the thickness of a sheet of paper or cloth.

Figure 1:
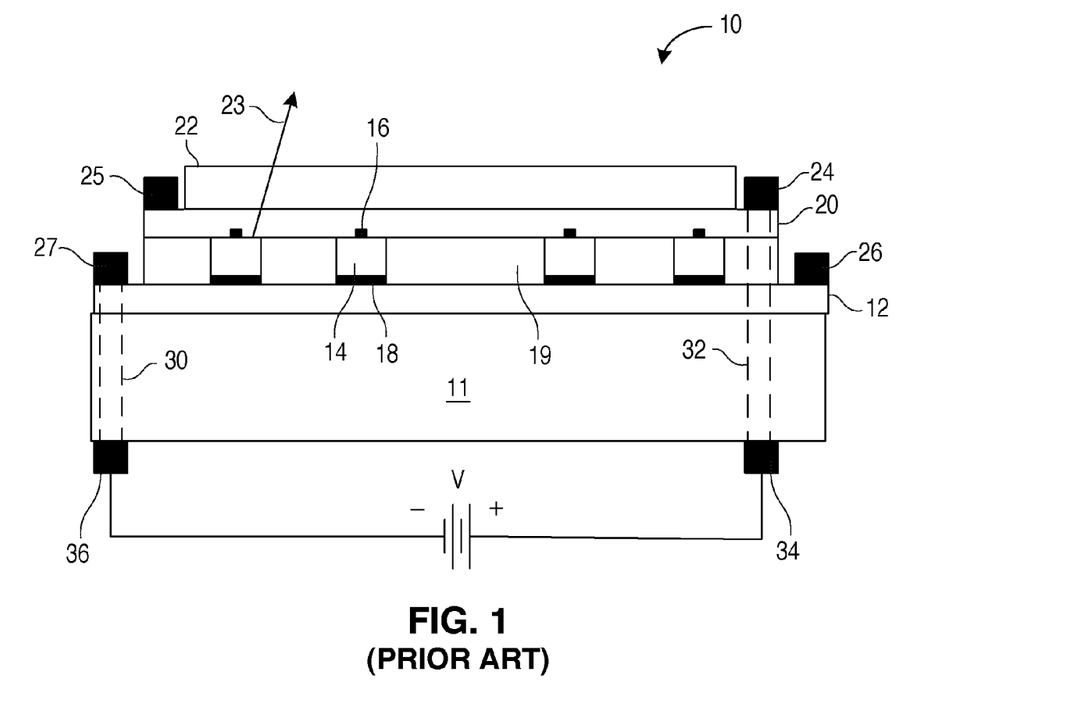
FIG. 1 is a cross-section of a prior art thin, flat, flexible light sheet emitting light opposite to the substrate surface, where a phosphor layer may be used to create white light.
Figure 2:
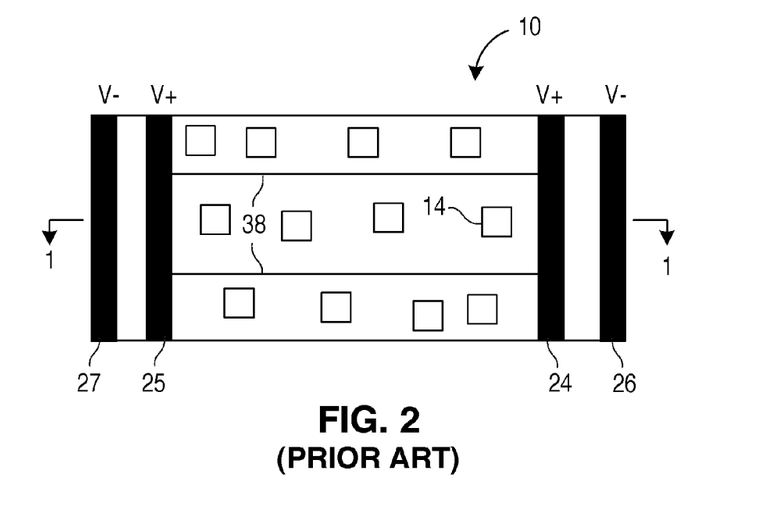

FIGS. 1 and 2 illustrate such a light sheet 10. The size of the light sheet 10 and the pattern of printed LEDs may be customized for a particular application.

In FIG. 1, a starting substrate 11 may be polycarbonate, PET (polyester), PMMA, Mylar or other type of polymer sheet, or even a thin metal film, paper, cloth, or other material. In one embodiment, the substrate 11 is about 25-50 microns thick.

A conductor layer 12 is then deposited over the substrate 11, such as by printing. The substrate 11 and/or conductor layer 12 may be reflective if the light from the LEDs is to only be emitted from the opposite side. For example, the conductor layer 12 may be a printed aluminum layer or a laminated aluminum film. Alternatively, a reflective layer may be first laminated over the substrate 11 followed by printing a transparent conductor layer 12 over the reflective film. A reflective film, including a white diffusing paint, may also be provided on the back surface of the substrate 11.

A monolayer of microscopic inorganic LEDs 14 is then printed over the conductor layer 12. The LEDs 14 are vertical LEDs and include standard semiconductor GaN layers, including an n-layer, and active layer, and a p-layer. GaN LEDs typically emit blue light. The LEDs 14, however, may be any type of LED emitting red, green, yellow, or other color light.

The GaN-based micro-LEDs are less than a third the diameter of a human hair and less than a tenth as high, rendering them essentially invisible to the naked eye when the LEDs are sparsely spread across the substrate 11 to be illuminated. This attribute permits construction of a nearly or partially transparent light-generating layer made with micro-LEDs. In one embodiment, the LEDs 14 have a diameter less than 50 microns and a height less than 10 microns. The number of micro-LED devices per unit area may be freely adjusted when applying the micro-LEDs to the substrate 11. A well dispersed random distribution across the surface can produce nearly any desirable surface brightness. Lamps well in excess of 10,000 cd/m$^2$ have been demonstrated by the assignee. The LEDs may be printed as an ink using screen printing or other forms of printing. Further detail of forming a light source by printing microscopic vertical LEDs, and controlling their orientation on a substrate, can be found in US application publication US 2012/0164796, entitled, Method of Manufacturing a Printable Composition of Liquid or Gel Suspension of Diodes, assigned to the present assignee and incorporated herein by reference.

In one embodiment, an LED wafer, containing many thousands of vertical LEDs, is fabricated so that the top metal electrode 16 for each LED is small to allow light to exit the top surface of the LEDs. The bottom metal electrode 18 is reflective (a mirror) and should have a reflectivity of over 90% for visible light. There is some side light, depending on the thickness of the LED. In the example, the anode electrode is on top and the cathode electrode is on the bottom.

The LEDs are completely formed on the wafer, including the anode and cathode metallizations, by using one or more carrier wafers during the processing and removing the growth substrate to gain access to both LED surfaces for metallization. The LED wafer is bonded to the carrier wafer using a dissolvable bonding adhesive. After the LEDs are formed on the wafer, trenches are photolithographically defined and etched in the front surface of the wafer around each LED, to a depth equal to the bottom electrode, so that each LED has a diameter of less than 50 microns and a thickness of about 4-8 microns, making them essentially invisible to the naked eye. A preferred shape of each LED is hexagonal. The trench etch exposes the underlying wafer bonding adhesive. The bonding adhesive is then dissolved in a solution to release the LEDs from the carrier wafer. Singulation may instead be performed by thinning the back surface of the wafer until the LEDs are singulated. The LEDs 14 of FIG. 1 result, depending on the metallization designs. The microscopic LEDs 14 are then uniformly infused in a solvent, including a viscosity-modifying polymer resin, to form an LED ink for printing, such as screen printing, or flexographic printing.

The LED ink is then printed over the conductor layer 12. The orientation of the LEDs 14 can be controlled by providing a relatively tall top electrode 16 (e.g., the anode electrode), so that the top electrode 16 orients upward by taking the fluid path of least resistance through the solvent after printing. The anode and cathode surfaces may be opposite to those shown. The LED ink is heated (cured) to evaporate the solvent. After curing, the LEDs remain attached to the underlying conductor layer 12 with a small amount of residual resin that was dissolved in the LED ink as a viscosity modifier. The adhesive properties of the resin and the decrease in volume of resin underneath the LEDs 14 during curing press the bottom cathode electrode 18 against the underlying conductor layer 12, creating a good electrical connection. Over 90% like orientation has been achieved, although satisfactory performance may be achieved with over 75% of the LEDs being in the same orientation.

A transparent polymer dielectric layer 19 is then selectively printed over the conductor layer 12 to encapsulate the sides of the LEDs 14 and further secure them in position. The ink used to form the dielectric layer 19 pulls back from the upper surface of the LEDs 14, or de-wets from the top of the LEDs 14, during curing to expose the top electrodes 16. If any dielectric remains over the LEDs 14, a blanket etch step may be performed to expose the top electrodes 16.

A transparent conductor layer 20 is then printed to contact the top electrodes 16. The conductor layer 20 is cured by lamps to create good electrical contact to the electrodes 16.

The LEDs 14 in the monolayer, within a defined area, are connected in parallel by the conductor layers 12/20 since the LEDs 14 have the same orientation. Since the LEDs 14 are connected in parallel, the driving voltage will be approximately equal to the voltage drop of a single LED 14.

A flexible, polymer protective layer 22 may be printed over the transparent conductor layer 20. If wavelength conversion is desired, a phosphor layer may be printed over the surface, or the layer 22 may represent a phosphor layer. The phosphor layer may comprise phosphor powder (e.g. a YAG phosphor) in a transparent flexible binder, such as a resin or silicone. Some of the blue LED light leaks through the phosphor layer and combines with the phosphor layer emission to produce, for example, white light. A blue light ray 23 is shown.

The flexible light sheet 10 of FIG. 1 may be any size and may even be a continuous sheet formed during a roll-to-roll process that is later stamped out for a particular application.

FIGS. 1 and 2 also illustrate how the thin conductor layers 12 and 20 on the light sheet 10 may be electrically contacted along their edges by metal bus bars 24-27 that are printed and cured to electrically contact the conductor layers 12 and 20. The metal bus bars along opposite edges are shorted together by a printed metal portion outside of the cross-section. The structure may have one or more conductive vias 30 and 32 (metal filled through-holes), which form a bottom anode lead 34 and a bottom cathode lead 36 so that all electrical connections may be made from the bottom of the substrate 11. Instead of vias, the top metal may be connected to the bottom metal by other means, such as metal straps extending over the edges of the light sheet. A suitable voltage differential applied to the leads 34 and 36 turns on the LEDs 14 to emit light through one or both surfaces of the light sheet 10.

FIG. 2 is a top down view of the light sheet 10 of FIG. 1, where FIG. 1 is taken along line 1-1 in FIG. 2. If the light sheet 10 is wide, there will be a significant IR drop across at least the transparent conductor layer 20. Thin metal runners 38 may be printed along the surface of the conductor layer 20 between the opposing bus bars 24 and 25 to cause the conductor layer 20 to have a more uniform voltage, resulting in more uniform current spreading. In an actual embodiment, there may be thousands of LEDs 14 in a light sheet 10.

Figure 3:
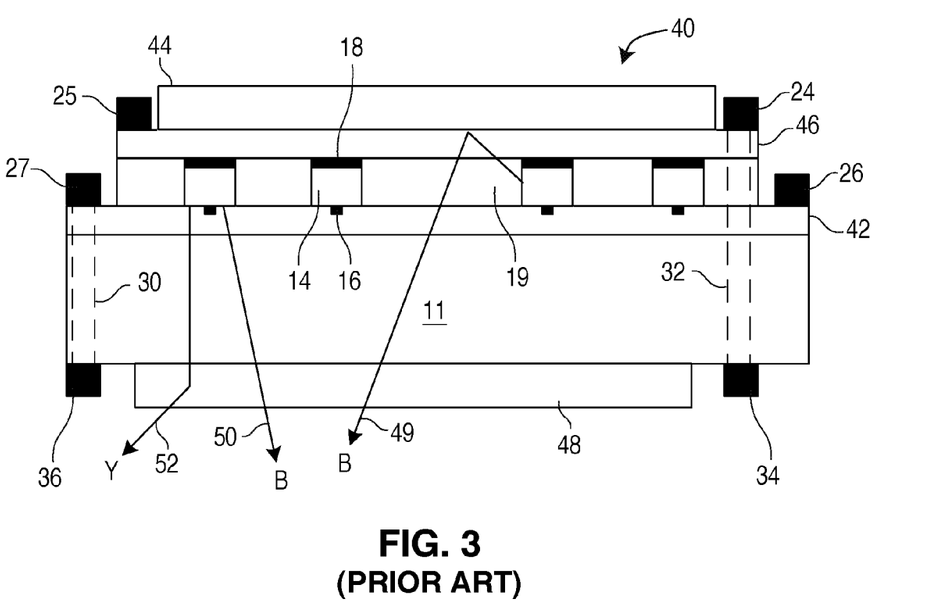
FIG. 3 is a cross-section of a prior art light sheet similar to FIG. 1 but with the LED light being emitted through the transparent substrate and where a phosphor layer is provided on the substrate's light emission surface.

FIG. 3 is a cross-sectional view of a related embodiment of a flat light sheet 40 where the LEDs 14 emit light toward the transparent substrate 11 through a transparent conductor layer 42. The top layer 44 may be a reflector, and the top conductor layer 46 may be transparent or a reflector. In the example, the transparent substrate 11 has a yellow phosphor layer 48, such as a YAG phosphor in a transparent binder, printed over it. Some of the blue LED light leaks through the phosphor layer 48, shown as blue light rays 49 and 50, and some of the blue LED light is wavelength-converted by the phosphor layer 48 to create a yellow light ray 52. When the blue light and yellow light combine, the light appears white.

Figure 4:
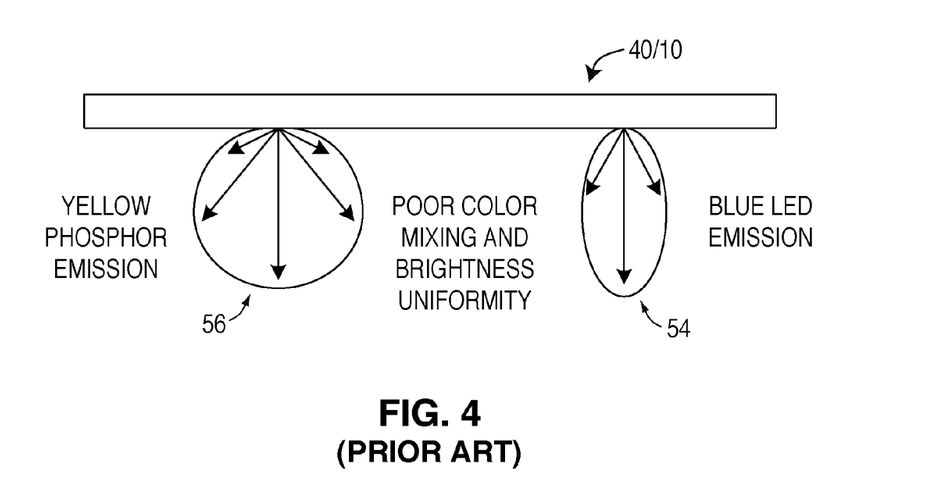
FIG. 4 illustrates the light sheet of FIG. 1 or 3 showing how the blue LED light has an emission profile that is different from the phosphor's emission profile, leading to brightness and color non-uniformity.

As shown in FIG. 4, in both the embodiments of FIGS. 1 and 3, the blue LED light exiting the phosphor layer has a strong normal component and much weaker low-angle components due to the nature of the structure. For example, shallow LED light rays are internally reflected. The half-power blue light emission profile 54 is shown as an oval. On the other hand, the light emitted by the phosphor layer (in either embodiment) is more Lambertian. The half-power phosphor emission profile 56 is shown as circle. As a result, there is relatively poor brightness and color uniformity versus viewing angle due to insufficient mixing of the light. More specifically, the light appears bluer when approaching an angle normal to the light sheet.

Further, the brightness and color non-uniformity occurs even at a normal angle, since the light will be bluer and brighter directly over each LED.

Even if there were no phosphor layer, there is little mixing of the blue LED light, resulting in poor brightness uniformity.

If better light mixing, for color and/or brightness uniformity, is desired, a diffuser sheet needs to be spaced from the light sheet. The stand-off height undesirably increases the form factor thickness and thus decreases the advantage of a thin printed light source.

Additionally, when the white-light light sheet is used for overhead lighting of a room, there is a wide angle of emission that results in a large amount of glare (direct viewing of the light emission by an observer). In such applications, it would be desirable for the light to be more directed downward while having good brightness and color uniformity.

What is needed is a technique for increasing the brightness and color uniformity of a thin light sheet and for controlling the directionality of the light, such as for decreasing glare when the light sheet is an overhead light for illuminating a room.

SUMMARY

In one embodiment, a thin light sheet containing a layer of inorganic LED dies sandwiched between two conductors is folded, such as by molding or stamping, to form a 3-dimensional structure where the emitted light rays mix to achieve improved brightness and color uniformity at all viewing angles. The invention is particular useful when the light sheet has a phosphor layer over it and the LED light and phosphor light combine to produce a composite color, such as white light. The folded light sheet has angled light-emitting walls or even vertical walls so that most of the light emitted from the walls mixes with light emitted from other walls and is ultimately reflected away from the light sheet. Flat surfaces between the walls are reflective. In some embodiments, part or all of some angled walls is reflective.

The folds may form an accordion-shaped light sheet. The extent of light mixing generally corresponds to the depths, angles, and pitches of the folds, but folds having any depth, angle, and pitch greatly improve the light mixing and reduces glare when the light sheet is used as an overhead white light source.

In another embodiment, the folds create an array of open boxes, or pyramids, or hexagons. Other fold patterns are contemplated and described.

In one embodiment, to strongly retain the folds in the thin light sheet, an adhesive material is deposited in the folds to provide mechanical support. Alternatively, the folded structure is affixed to a back sheet.

The LEDs may instead be formed using other techniques and may be much larger or smaller. The lamps described herein may be constructed by techniques other than printing.

BRIEF DESCRIPTION OF THE DRAWINGS

FIG. 2 is a top down view of the structure of FIG. 1, where FIG. 1 is taken along line 1-1 in FIG. 2.

Elements that are similar or identical in the various figures are labeled with the same numeral.

DETAILED DESCRIPTION

In all embodiments, the flat light sheet 10/40 shown in FIGS. 1-4 may be used as the starting structure. The light sheet 10/40 is very flexible and has a thickness on the order of paper or cloth, such as between 5-13 mils. The various embodiments show the light sheet folded, such as by sandwiching the flat light sheet between a heated mold under pressure to create the folds, then cooling the folded light sheet and removing it from the mold. Other techniques may be used to fold the light sheet. The flat light sheet containing LEDs may be other than the specific designs of FIGS. 1-4, but it is important for the light sheet to be very thin and foldable. The density of LEDs may be any value, depending on the desired light output.

If there is a concern about a fold occurring across a printed LED 14 and possibly breaking an electrical contact between the LED electrodes and one of the conductor layers, the LEDs may be printed only in areas where there will be no fold, such as by using screen printing with a mask layer on the screen. The LEDs will still be generally randomly distributed in the areas in which the LEDs are printed.

The transparent conductor layer and other conductor layers may be formed to be very flexible and foldable. For example the printed transparent conductor layer, which contacts an LED electrode and allows light to pass through, may be a thin layer of sintered silver nano-wires forming a mesh. The light passes through the openings in the mesh. Such a transparent conductor ink is commercially available. The printed ink containing the nano-wires is heated to evaporate the solvent and sinter the overlapping nano-wires to form a conductive mesh. ITO is a well-known transparent conductor but may be too brittle to fold and provide a reliable current path.

Figure 5:
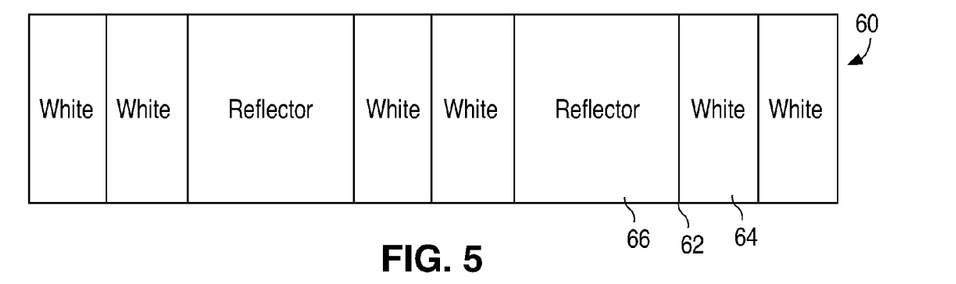
FIG. 5 is a top down view of a flat light sheet, in accordance with one embodiment of the invention, showing fold lines, white light emission areas (e.g., coated with a YAG phosphor), and reflective areas where no LEDs or phosphor are located.

FIG. 5 is a top down view of a flat light sheet 60 showing the fold lines 62, white light emission areas 64, and reflective areas 66 where no LEDs or phosphor are located. The view is of the light emission surface. The white light emission areas 64 may have a top layer of a YAG phosphor with an underlying monolayer of printed blue LEDs. The reflective areas 66 may simply be areas where no LEDs or phosphor are printed, and the reflector may be the layer 44 in FIG. 3, or the conductor layer 12 or substrate 11 in FIG. 1. Alternatively, the reflective areas 66 may be formed by printing a reflective layer, such as silver, over the top surface of the light sheet 60. The light sheet 60 may be any size, such as sufficient to replace a 4×8 foot fluorescent troffer for overhead room lighting.

Since at least the substrate of the light sheet 60 (e.g., the substrate 11 in FIGS. 1-4) is a type of plastic, it may be easily moldable using a heated mold. The mold softens the light sheet while providing pressure to fold the light sheet 60 along the lines 62. The mold may have a top portion with a negative pattern of triangular ridges, and a bottom portion with a positive pattern of the triangular ridges, where the flat light sheet is sandwiched between the mold portions under pressure and heat. Alternatively, the mold may be opposing heated rollers with triangular ridges so the folding can occur on a conveyor system. When the light sheet is then removed from the mold and cools, it will generally retain its shape.

Figure 6:
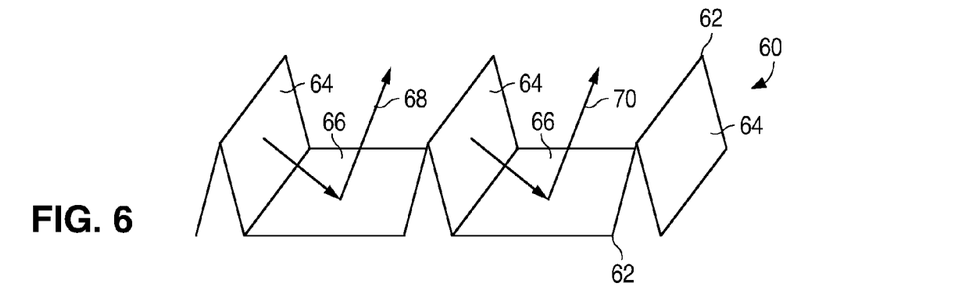
FIG. 6 illustrates the light sheet of FIG. 5 folded along the fold lines.

FIG. 6 illustrates the light sheet 60 after it is folded, where the folds may form rows of elongated triangles. The downward emitted white light rays 68 and 70 are shown being reflected off the reflective areas 66. These light rays 68/70 can be blue light from the LEDs or light emitted by the phosphor. Upward emitted white light directly exits the light sheet without reflection. The various light rays are better mixed using the structure of FIG. 6.

There may be hundreds of folds, depending on the size of the light sheet. The heights of the folded features, the angles of the features, and their pitch affect the light mixing and glare. Shallower folds with a larger pitch will generally emit more direct light without mixing and will result in more glare and non-uniformity of brightness and color. Steeper features with a smaller pitch will result in more mixing and less glare. Reducing the pitch allows more LEDs to be printed, resulting in a brighter lamp, but there may be more absorption of light by the opposing angled wall. A larger pitch allows more light to be reflected off the reflective areas 66 between the folds without absorption. More folds equate to a thinner light sheet, which may be desirable. Larger folds may equate to a more mechanically strong light sheet in the direction of the folds. As seen, there are tradeoffs, and the optimal design depends on the specific application of the light sheet.

Although the various light rays emitted by adjacent features will be mixed very well, the light will also be mixed with the light from all the other walls facing in the same direction. There is much less direct light emitted normal to the light sheet.

Since some blue LED light passes through the phosphor layer and impinges on an opposing phosphor layer, creating additional yellow light, this effect needs to be taken into account when designing the light sheet. This recycling of blue light allows the phosphor layers to be made thinner, reducing costs and increasing optical efficiency. This applies to all the embodiments described herein.

For even greater mixing and uniformity, the reflective areas 66 may be roughened to scatter the light.

Figure 7:
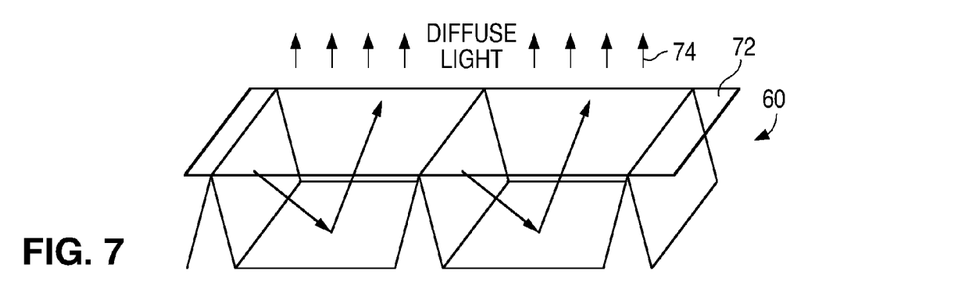
FIG. 7 illustrates the folded light sheet of FIG. 6 with a diffuser sheet attached over the top of the light sheet.

As shown in FIG. 7, for even greater mixing and reducing glare, a translucent diffuser sheet 72 may be provided. Uniformity increases as glare decreases. The diffuser sheet 72 may have a roughened surface or have prisms, bumps, embedded diffusing particles, or other features that scatter and mix the light. Alternatively, the diffuser sheet 72 may have optical features that redirect the light to be more normal to its surface to reduce glare and increase the brightness normal to the light sheet 60. Such normal light rays 74 are shown.

Figure 8:
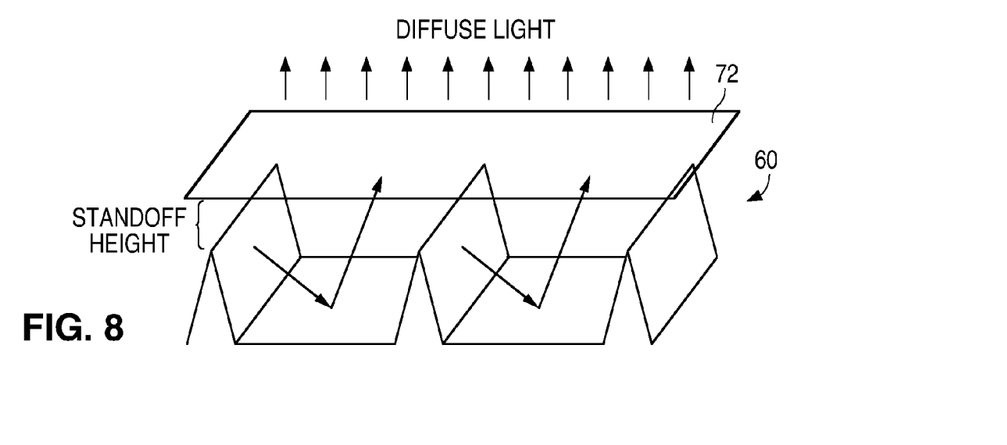
FIG. 8 illustrates the folded light sheet of FIG. 6 with a diffuser sheet spaced away from the top of the light sheet for improved brightness and color uniformity.

FIG. 8 illustrates the diffuser sheet 72 being separated from the light sheet 60 by a stand-off height so that the light that enters the diffuser sheet 72 is more mixed and more uniform. This avoids the apexes of the walls appearing as dark lines. The diffuser sheet 72 may be fixed in position by an external frame that also holds the light sheet 60.

Figure 9:
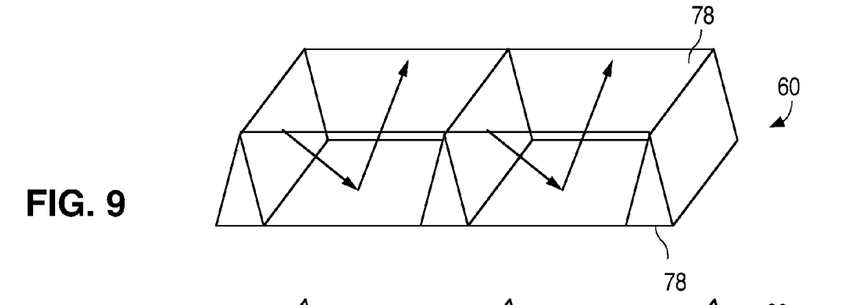
FIG. 9 illustrates the folded light sheet of FIG. 6 with an adhesive deposited on the top surface, the bottom surface, or both for adding structural integrity to the folds.

As shown in FIG. 9, since the light sheet 60 is very thin and flexible, and the folds may not retain their shape after molding, the non-emission side of the light sheet 60 may be covered with a dielectric material 78 that fills the fold channels (or troughs) and adheres to the light sheet 60 for adding structural integrity. FIG. 9 also shows that the fill material may optionally fill the light emission side of the light sheet and be transparent. The surface may be roughened or molded to improve light extraction. The resulting light sheet 60 is thus planar on one or both sides. The material 78 may be applied as a liquid to fill the voids via injection molding, coating, dispensing, extrusion or other method, and is cured. The material 78 may be thermally conductive. The material 78 may be rigid or relatively soft, since there is generally little stress on the material 78 itself. The material 78 may be a resin, silicone, or another type of polymer adhesive.

In another embodiment, the material 78 may be pre-molded and affixed to the light sheet with an adhesive.

The material 78 may also be used to improve light extraction by having a suitable index of refraction.

Figure 10:
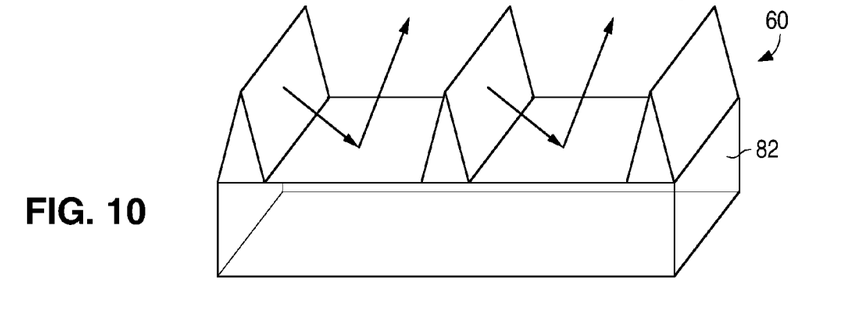
FIG. 10 illustrates the folded light sheet of FIG. 6 with a back sheet affixed to it for adding structural integrity to the folds.

FIG. 10 illustrates the folded light sheet 60 of FIG. 6 with a back sheet 82 affixed to it for adding structural integrity to the folds. The back sheet 82 may be any suitable material, such as the same material used for the substrate 11 (FIG. 3), or may be much thicker. The back sheet 82 may be flexible or semi-rigid. A semi-rigid back sheet 82 may be used to form a self-supported light sheet for use as an overhead light, where only an outer frame is used to support the light sheet. The back sheet 72 may also ease the fabrication process when multiple light sheet sections are interconnected to form a larger light sheet.

Figure 11:
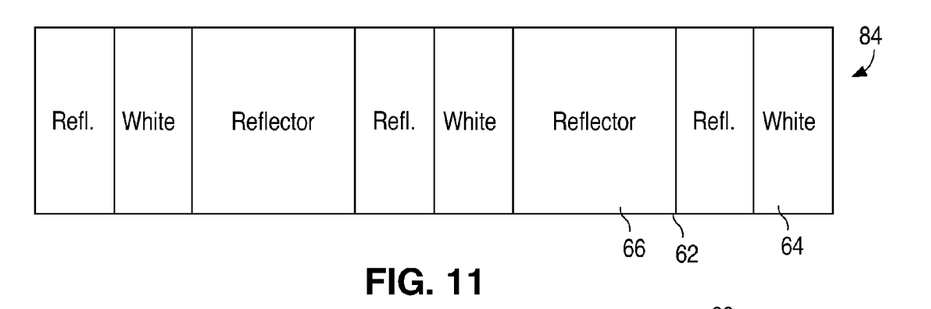
FIG. 11 is a top down view of another flat light sheet showing fold lines, white light emission areas (e.g., coated with a YAG phosphor), and reflective areas where no LEDs or phosphor are located.

FIG. 11 is a top down view of another flat light sheet 84 showing the fold lines 62, white light emission areas 64 (e.g., coated with a YAG phosphor), and reflective areas 66 where no LEDs or phosphor are located.

Figure 12:
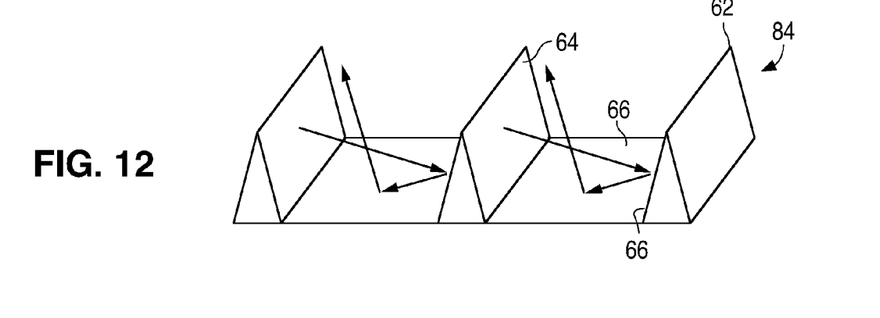
FIG. 12 illustrates the light sheet of FIG. 11 folded along the fold lines.

FIG. 12 illustrates the light sheet 84 of FIG. 11 folded along the fold lines. In contrast to the light sheet 60 of FIG. 6, the light sheet 84 has some reflective angled walls as well as a reflective flat surface. This may be used for achieving some directionality of the light emission or other optical effects and reducing light absorption.

Figure 13:
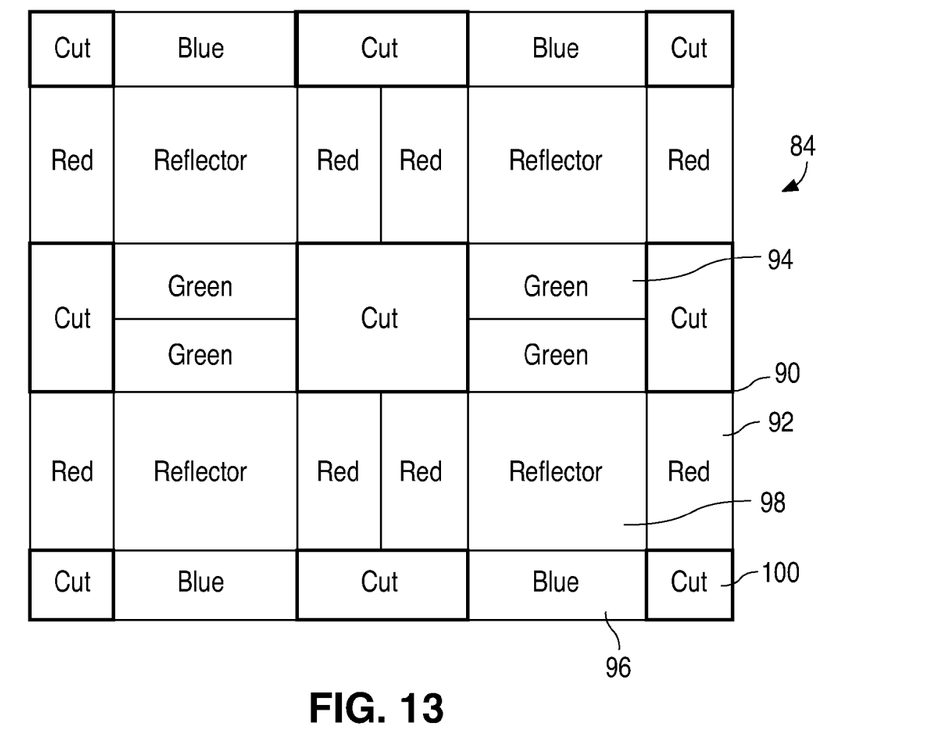
FIG. 13 is a top down view of another flat light sheet showing fold lines, red light emission areas, green light emission areas, blue light emission areas, reflective areas, and cut areas. The red and green emission areas may coincide with red and green phosphors over blue LEDs, and the blue emission areas may coincide with no phosphor over the blue LEDs.

FIG. 13 is a top down view of another flat light sheet 88 showing the fold lines 90, red light emission areas 92, green light emission areas 94, blue light emission areas 96, reflective areas 98, and cut areas 100. The red and green emission areas 92/94 may coincide with red and green phosphors over blue LEDs, and the blue emission areas 96 may coincide with no phosphor over the blue LEDs. If all the LEDs are blue-emitting GaN LEDs, they may all be connected in parallel. Alternatively, no phosphors may be used and the red emission areas 92 may contain red-emission LEDs, the green emission areas 94 may contain green-emission LEDs, and the blue emission areas 96 may contain blue LEDs.

Figure 14:
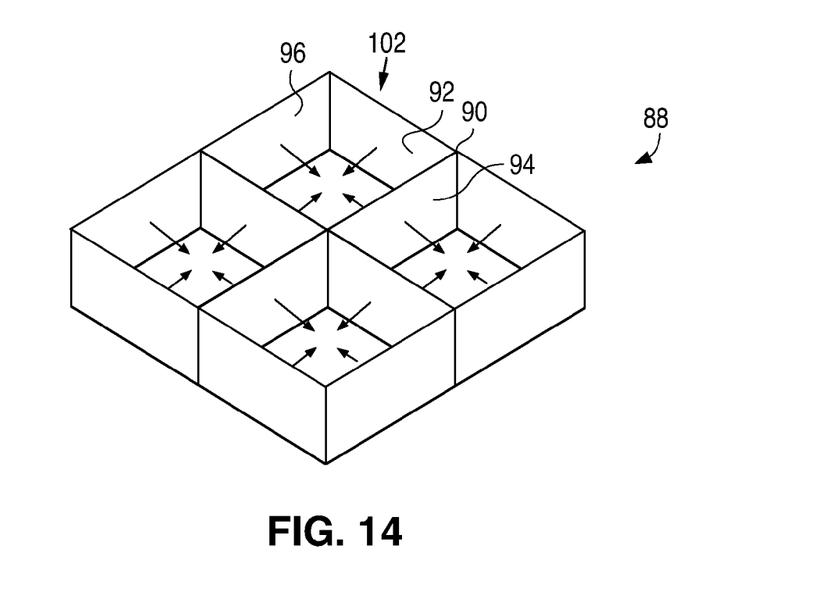
FIG. 14 illustrates the light sheet of FIG. 13 folded along the fold lines, where an array of open boxes is formed.

FIG. 14 illustrates the light sheet 88 of FIG. 13 folded along the fold lines 90, where an array of open boxes 102 (or cubes) is formed. Each box has walls emitting red, green, and blue light, and has a bottom reflector. Each box 102 mixes the light from the three colors to emit white light. The light is further mixed by the proximity of the small boxes. Each box 102 may be a few millimeters across or larger, so a single light sheet may have thousands of such mixing boxes 102. The size of the boxes affects the thickness of the folded light sheet. If the opposite side of the flat light sheet 88 is adhesive, the folded light sheet 88 of FIG. 14 will be semi-rigid. The folded light sheet 88 may also have a semi-rigid backing sheet for structural integrity. For color uniformity, it is important the all the walls of the folded light sheet 88 be at the same angle, in this case forming a square box. The color components of the white light can be adjusted by adjusting the density of printed LEDs in each area, the type of phosphor (if used), the thickness of the phosphor layers, and the sizes of the areas in each box. Also, the LEDs in the different color areas (RGB) can be connected to separate power supplies to individually adjust the RGB percentages to create virtually any color.

Forming boxes or other shapes increases the directionality of the light and reduces glare, such as for applications where the folded light sheet is used for overhead lighting of a room. Instead of separate RGB areas, the walls of the boxes may all generate white light by being coated with a yellow phosphor.

Figure 15:
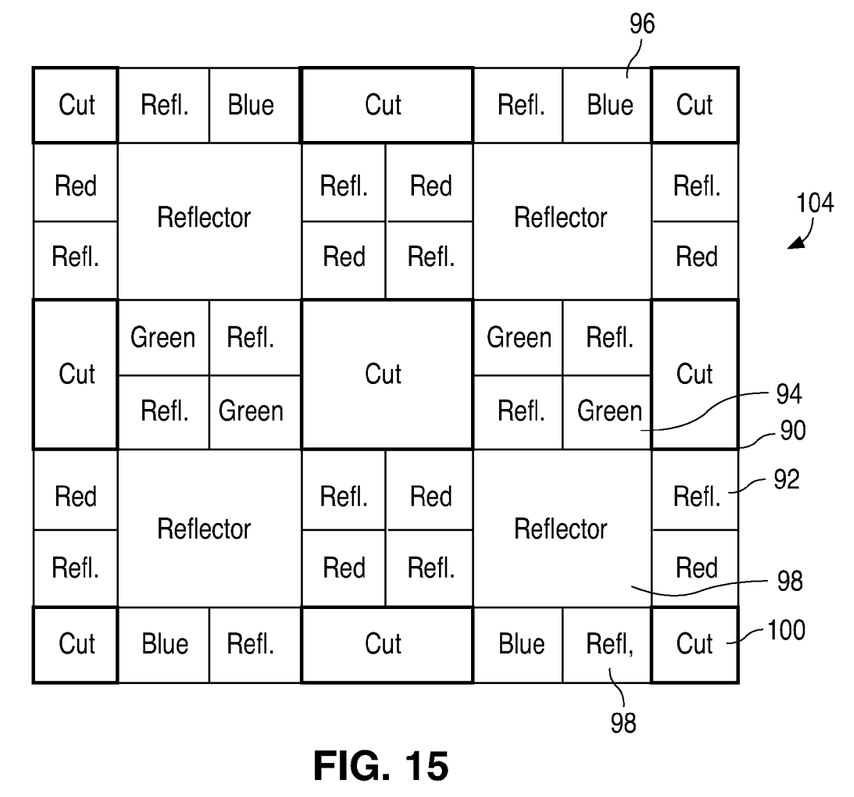
FIG. 15 is a variation of the light sheet design of FIG. 13.

FIG. 15 illustrates a flat light sheet 104, which is a variation of the light sheet 88 of FIG. 13, showing the fold lines 90, red light emission areas 92, green light emission areas 94, blue light emission areas 96, reflective areas 98, and cut areas 100.

Figure 16:
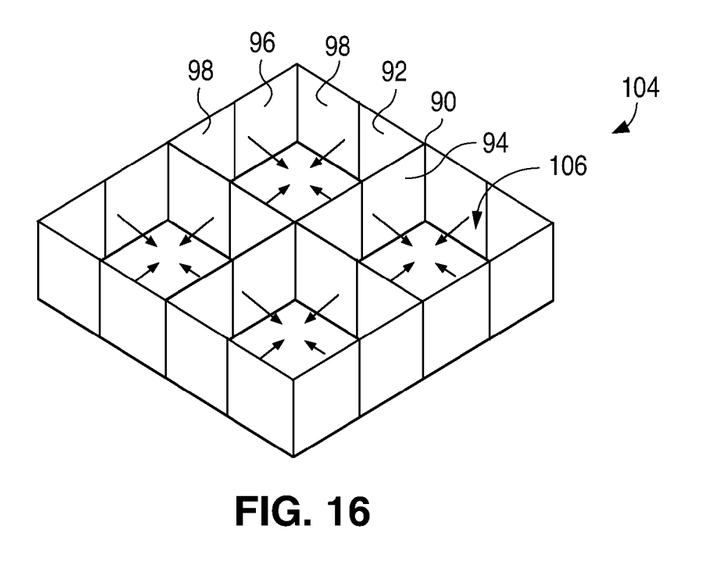
FIG. 16 illustrates the light sheet of FIG. 15 folded along the fold lines, where an array of open boxes is formed.

FIG. 16 illustrates the light sheet 104 of FIG. 15 folded along the fold lines 90, where an array of open boxes 106 is formed. Each box 106 has walls that emit red, green, and blue light to generate white light. Reflective areas 98 are at the bottoms and on the walls to improve color mixing and reduce absorption of the light. Opposing walls in each box 106 emit a different color, and the opposing wall is half-reflector to minimize absorption.

In FIGS. 14 and 16, the walls of the boxes can be made less than 90 degrees to increase the amount of light that directly exits the light sheet without reflection, improving optical efficiency at a cost of reduced uniformity. Some reduction of color or brightness uniformity will not be noticed if the light sheet is intended for general lighting and is not directly viewed.

Figure 17:
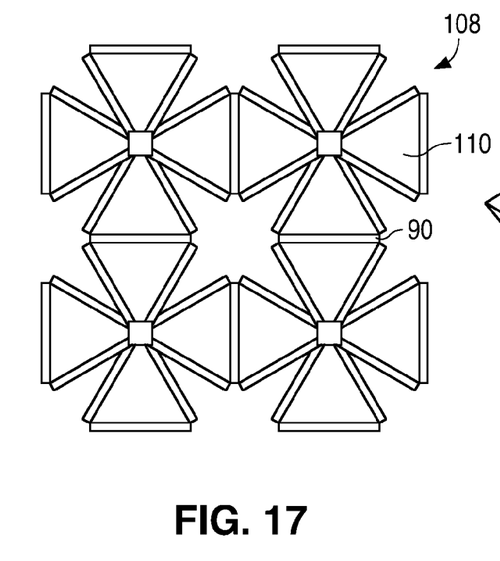
FIG. 17 is a top down view of another flat light sheet showing fold lines, where the surface is covered with a yellow YAG phosphor layer overlying blue LEDs.

FIG. 17 is a top down view of another flat light sheet 108 showing the fold lines 90, where the surface is covered with a yellow YAG phosphor layer 110 overlying blue LEDs to emit white light.

Figure 18:
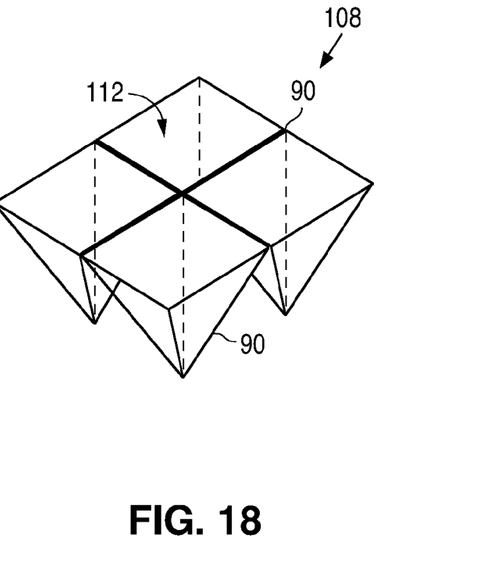
FIG. 18 illustrates the light sheet of FIG. 17 folded along the fold lines, where an array of open pyramids is formed.

FIG. 18 illustrates the light sheet 108 of FIG. 17 folded along the fold lines 90, where an array of open pyramids 112 is formed. No reflector is used. As in the embodiments of FIGS. 14 and 16, the light is highly directional and mixed. Hundreds or thousands of the four-sided pyramids 112 may be formed in a single light sheet 108. The angles of the pyramid walls can be used to control glare and directionality. Three-sided pyramids may also be formed.

Figure 19:
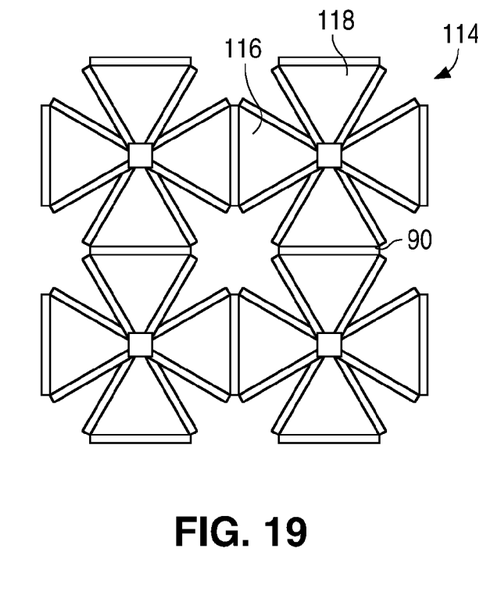
FIG. 19 is a top down view of another flat light sheet showing fold lines, where some areas are covered with a yellow YAG phosphor layer overlying blue LEDs and other areas are reflective.

FIG. 19 is a top down view of another flat light sheet 114 showing the fold lines 90, where some areas are covered with a yellow YAG phosphor layer 116 overlying blue LEDs and other areas are reflective areas 118.

Figure 20:
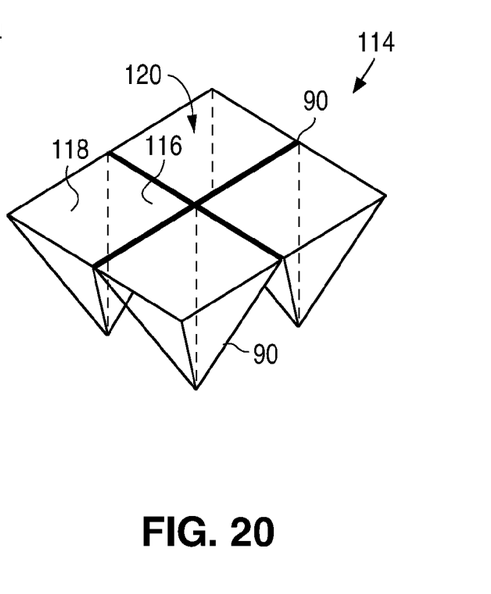
FIG. 20 illustrates the light sheet of FIG. 19 folded along the fold lines, where an array of open pyramids is formed.

FIG. 20 illustrates the light sheet of FIG. 19 folded along the fold lines, where an array of open pyramids 120 is formed. The reflective areas 118 reduce absorption of the light.

Figure 21:
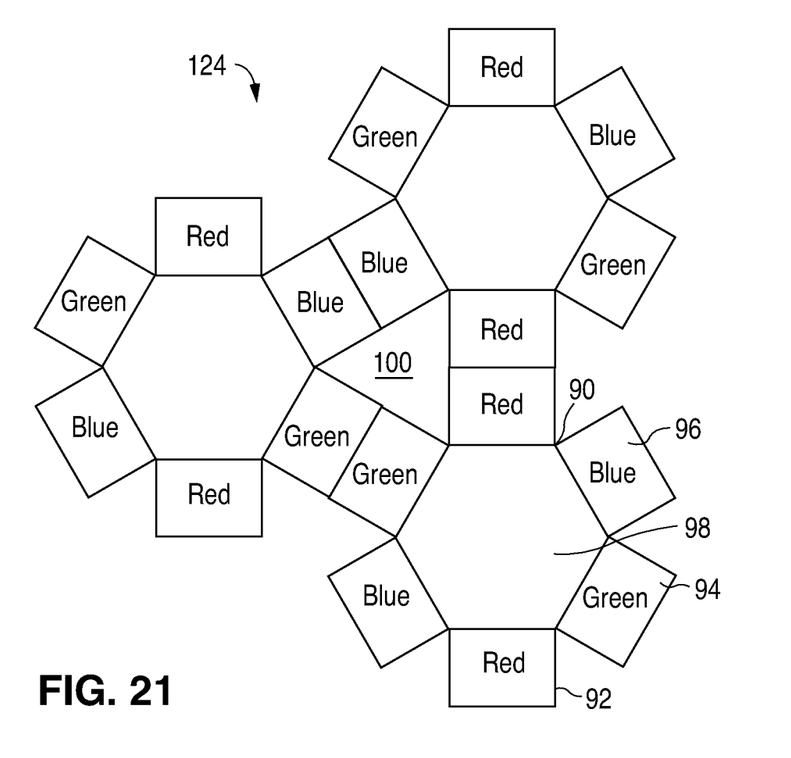
FIG. 21 is a top down view of another flat light sheet showing fold lines, red light emission areas, green light emission areas, blue light emission areas, reflective areas, and a cut area.

FIG. 21 is a top down view of another flat light sheet 124 showing the fold lines 90, red light emission areas 92, green light emission areas 94, blue light emission areas 96, reflective areas 98, and a central cut area 100.

Figure 22:
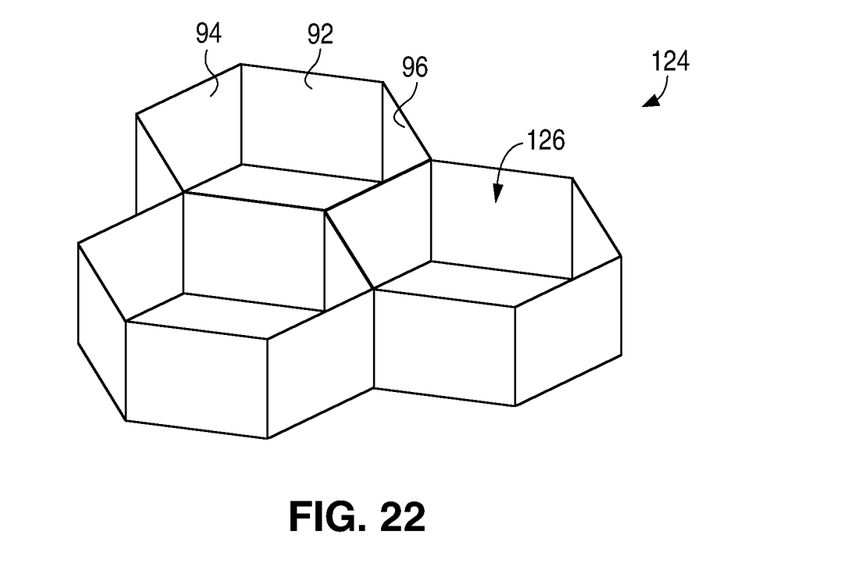
FIG. 22 illustrates the light sheet of FIG. 21 folded along the fold lines, where an array of open hexagons is formed.

FIG. 22 illustrates the light sheet 124 of FIG. 21 folded along the fold lines 90, where an array of open hexagons 126 is formed having a reflective bottom surface. Each hexagon 126 emits white light. The color temperature of the white light may be adjusted as previously described. Walls of the same color face each other for increased color purity, so a hexagon is ideal for mixing three colors. For mixing four colors, octagons are preferred.

Figure 23:
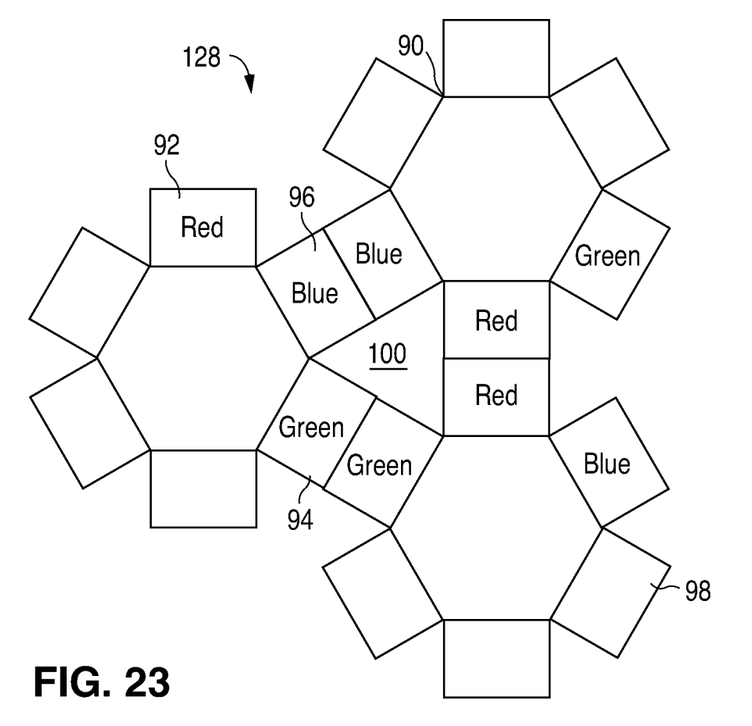
FIG. 23 is a top down view of another flat light sheet showing fold lines, red light emission areas, green light emission areas, blue light emission areas, reflective areas, and a cut area.

FIG. 23 is a top down view of another flat light sheet 128 showing the fold lines 90, red light emission areas 92, green light emission areas 94, blue light emission areas 96, reflective areas 98, and a cut area 100.

Figure 24:
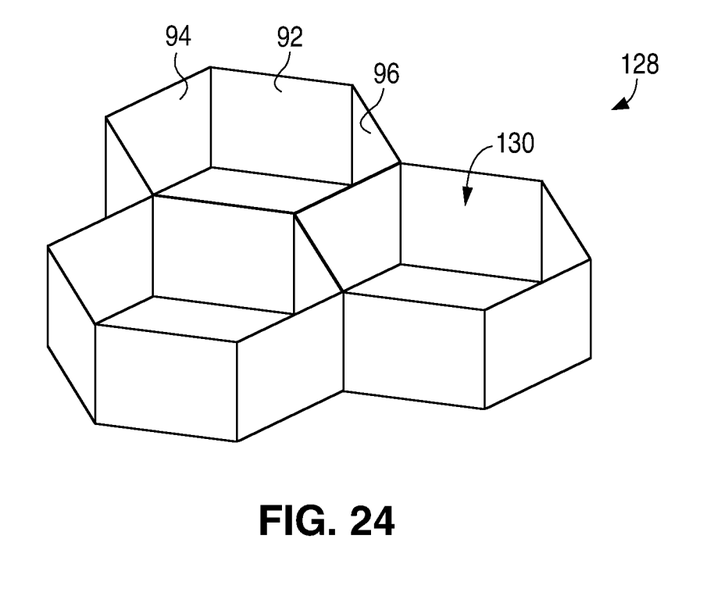
FIG. 24 illustrates the light sheet of FIG. 23 folded along the fold lines, where an array of open hexagons is formed.

FIG. 24 illustrates the light sheet 128 of FIG. 23 folded along the fold lines 90, where an array of open hexagons 130 is formed having reflective walls (each opposing a light-emitting wall) and a reflective bottom surface. The reflective areas 98 reduce absorption of the light. White light is emitted from each hexagon 130. In another embodiment, the positions of the red, green, and blue walls in the hexagons 130 are varied across the array to further mix the colors.

Many other arrangements of colors and reflectors in a folded light sheet are envisioned to achieve a desired directionality while also improving brightness and color uniformity across the light sheet and reducing glare. Periodic patterns of differently shaped polygons can be tiled.

The resulting folded light sheet may have any thickness, depending on the size of the folded features.

The folded light sheet may be used for applications including general lighting, displays (signs), addressable displays, backlighting, and automobile lights.

Any of the boxes, hexagons, or other shapes, and the various colors emitted by the shapes, can be independently controlled for an addressable color display by printing conductors leading to the LEDs in those sections and terminating the conductors at an X-Y decoder, where the decoder receives display signals and generates driving signals for illuminating the LEDs at the designated XY position in the light sheet. This can also be used for dynamic backlighting.

The folded light sheets may be easily bent to meet a wide range of form factors, such as bending the light sheet around corners or other non-planar surfaces. Cones or cylinders can also be formed.

All features described herein may be combined in various combinations to achieve a desired function.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting device comprising:
    a substrate having a first conductive surface;
    a layer of inorganic light emitting diodes (LEDs) deposited on the first conductive surface so that a bottom electrode of the LEDs electrically contacts the first conductive surface;
    a first dielectric layer deposited over the first conductive surface;
    a second conductor layer over the LEDs so that a top electrode of the LEDs electrically contacts the second conductor layer, wherein at least one of the first conductive surface or the second conductor layer is transparent,
    wherein the substrate, the first conductive surface, the layer of LEDs, the first dielectric layer, and the second conductor layer form a light sheet; and
    wherein the light sheet is folded to form a folded light sheet having an array of repeated identical light emitting segments, each segment having a plurality of planar light emitting walls at a plurality of angles such that some of the light emitting walls face each other for mixing of light.

2. The device of claim 1 wherein the first conductive surface and the substrate are transparent.

3. The device of claim 1 wherein the second conductor layer is transparent.

4. The device of claim 1 wherein the LEDs comprise blue light emitting LEDs, the device further comprising a phosphor layer over at least some of the LEDs.

5. The device of claim 1 wherein the light sheet is folded using a mold.

6. A light emitting device comprising:
    a substrate having a first conductive surface;
    a layer of inorganic light emitting diodes (LEDs) deposited on the first conductive surface so that a bottom electrode of the LEDs electrically contacts the first conductive surface;
    a first dielectric layer deposited over the first conductive surface;
    a second conductor layer over the LEDs so that a top electrode of the LEDs electrically contacts the second conductor layer, wherein at least one of the first conductive surface or the second conductor layer is transparent,
    wherein the substrate, the first conductive surface, the layer of LEDs, the first dielectric layer, and the second conductor layer form a light sheet;
    wherein the light sheet is folded to form a folded light sheet having a plurality of light emitting walls at a plurality of angles; and wherein the light sheet is folded to have linear rows of angled walls, wherein an area between opposing angled walls comprises a reflector.

7. The device of claim 1 wherein the light sheet comprises reflective areas and areas that generate light.

8. The device of claim 7 wherein the areas that generate light comprise areas that emit white light.

9. The device of claim 7 wherein the areas that generate light comprise areas that emit red, green, and blue light.

10. The device of claim 1 wherein the folded light sheet forms an array of multi-walled polygons with a light exit opening and a reflective bottom surface.

11. A light emitting device comprising:
- a substrate having a first conductive surface;
- a layer of inorganic light emitting diodes (LEDs) deposited on the first conductive surface so that a bottom electrode of the LEDs electrically contacts the first conductive surface;
- a first dielectric layer deposited over the first conductive surface;
- a second conductor layer over the LEDs so that a top electrode of the LEDs electrically contacts the second conductor layer, wherein at least one of the first conductive surface or the second conductor layer is transparent,
- wherein the substrate, the first conductive surface, the layer of LEDs, the first dielectric layer, and the second conductor layer form a light sheet;
- wherein the light sheet is folded to form a folded light sheet having a plurality of light emitting walls at a plurality of angles;
- wherein the folded light sheet forms an array of multi-walled polygons with a light exit opening and a reflective bottom surface; and
- wherein walls of the polygon include walls being at least partially reflective.

12. The device of claim 10 wherein walls of the polygon include opposing first walls emitting a same first color light, wherein one or more second walls in the polygon emit a second color light different from the first color light.

13. The device of claim 12 wherein all the LEDs are blue emitting LEDs, and at least some of the first walls or second walls include a layer of red-emitting phosphor and green-emitting phosphor.

14. The device of claim 10 wherein the polygons comprise boxes with four walls and a reflective bottom surface.

15. The device of claim 10 wherein the polygons comprise hexagons with six walls and a reflective bottom surface.

16. The device of claim 10 wherein the polygons comprise pyramids.

17. The device of claim 1 wherein the plurality of light emitting walls include walls that emit red, green, and blue light.

18. The device of claim 17 wherein the plurality of light emitting walls contain LEDs that emit red light, LEDs that emit green light, and LEDs that emit blue light.

19. The device of claim 1 further comprising a diffuser over the folded light sheet.

20. The device of claim 1 further comprising a material that structurally supports the folded light sheet.

21. The device of claim 1 wherein the layer of LEDs comprise microscopic printed LEDs.

* * * * *